US 6,700,414 B2

(12) United States Patent
Tsujino

(10) Patent No.: US 6,700,414 B2
(45) Date of Patent: Mar. 2, 2004

(54) PHASE COMPARATOR ACCURATELY COMPARING PHASES OF TWO CLOCK SIGNALS AND CLOCK GENERATION CIRCUIT EMPLOYING THE SAME

(75) Inventor: Mitsunori Tsujino, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/159,260

(22) Filed: Jun. 3, 2002

(65) Prior Publication Data
US 2003/0098721 A1 May 29, 2003

(30) Foreign Application Priority Data
Nov. 26, 2001 (JP) ........................................ 2001-358838

(51) Int. Cl.$^7$ ............................................. G01R 25/00
(52) U.S. Cl. .............................. 327/3; 327/158; 331/25; 331/1 A; 375/376
(58) Field of Search ................................ 327/2, 3, 5, 7, 327/8, 10, 146, 147, 149, 150, 153, 155, 156, 158, 161, 162, 291; 331/DIG. 2, 25, 1 A; 375/373, 376

(56) References Cited
U.S. PATENT DOCUMENTS
4,764,737 A  * 8/1988 Kaatz ......................... 331/1 A
5,142,555 A  * 8/1992 Whiteside ................... 375/327
5,233,636 A  * 8/1993 Lee et al. .................... 375/373
5,789,947 A  * 8/1998 Sato ................................ 327/3
6,157,690 A  * 12/2000 Yoneda ........................ 375/376
6,417,715 B2 * 7/2002 Hamamoto et al. ......... 327/291

FOREIGN PATENT DOCUMENTS
JP          5-110427        4/1993
JP          6-29835         2/1994

* cited by examiner

Primary Examiner—Minh Nguyen
(74) Attorney, Agent, or Firm—McDermott, Will & Emery

(57) ABSTRACT

A double phase comparator sets both first and second signals to an "L" level in order to delay a phase of a feedback clock signal when the feedback clock signal is at the "H" level and the "L" level at the rising and falling edges of an internal clock signal, respectively. The double phase comparator also sets both first and third signals to the "L" levels in order to advance a phase of a feedback clock signal when the feedback clock signal is at the "L" level and the "H" level at the rising and falling edges of an internal clock signal, respectively. Moreover, the double phase comparator sets the first signal to the "H" level in order to stop a phase control of the feedback clock signal when the feedback clock signal is at the same level at the rising and falling edges of an internal clock signal.

3 Claims, 9 Drawing Sheets

FIG.7
|   | φU1 | φD1 | φU2 | φD2 | φK | φU | φD |
|---|-----|-----|-----|-----|----|----|----|
| 1 | H   | L   | L   | H   | L  | H  | L  |
| 2 | L   | H   | H   | L   | L  | L  | H  |
| 3 | L   | H   | L   | H   | H  | L  | H  |
| 4 | H   | L   | H   | L   | H  | L  | H  |
FIG.8A
WHEN THE PHASE OF FBCLK PRECEDES:
(φK=L, φU=H, φD=L)
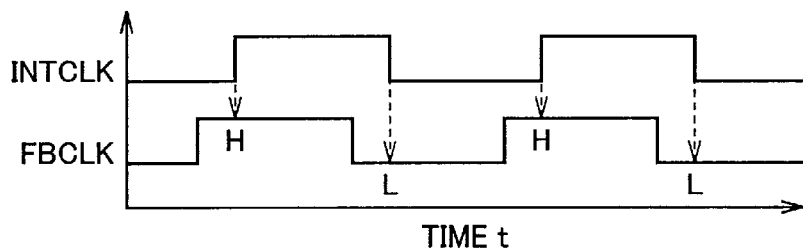
FIG.8B
WHEN THE PHASE OF FBCLK FOLLOWS:
(φK=L, φU=L, φD=H)
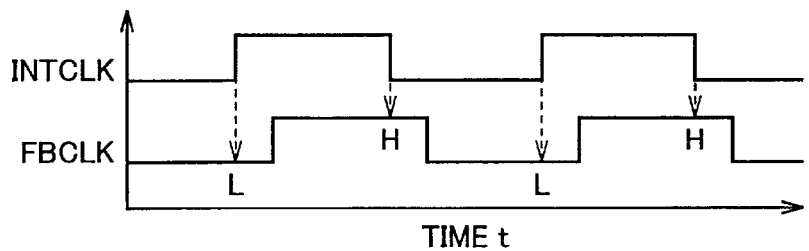

WHEN THE PHASE OF FBCLK PRECEDES WHILE THE WAVE FORM OF FBCLK IS DEFORMED:
($\phi$K=H, $\phi$U=L, $\phi$D=H)

WHEN INTCLK AND FBCLK ARE IN PHASE WHILE THE DUTY RATIO OF FBCLK IS ABOVE 50%:
($\phi$K=H, $\phi$U=L, $\phi$D=H)

WHEN INTCLK AND FBCLK ARE IN PHASE WHILE THE DUTY RATIO OF FBCLK IS BELOW 50%:
($\phi$K=H, $\phi$U=L, $\phi$D=H)

WHEN THE PHASE OF FBCLK PRECEDES:
($\phi$U=H, $\phi$D=L)

WHEN THE PHASE OF FBCLK FOLLOWS:
($\phi$U=L, $\phi$D=H)

WHEN THE PHASE OF FBCLK PRECEDES WHILE THE WAVE FORM OF FBCLK IS DEFORMED:
($\phi$U=L, $\phi$D=H)

WHEN INTCLK AND FBCLK ARE IN PHASE WHILE THE DUTY RATIO OF FBCLK IS ABOVE 50%:
($\phi$U=H, $\phi$D=L)

WHEN INTCLK AND FBCLK ARE IN PHASE WHILE THE DUTY RATIO OF FBCLK IS BELOW 50%:
($\phi$U=L, $\phi$D=H)

PHASE COMPARATOR ACCURATELY COMPARING PHASES OF TWO CLOCK SIGNALS AND CLOCK GENERATION CIRCUIT EMPLOYING THE SAME

BACKGROUND OF THE INVENTION

1. Field of the Invention

The present invention relates to a phase comparator and a clock generation circuit employing the phase comparator. More specifically, the present invention relates to a phase comparator comparing phases of first and second clock signals and to a clock generation circuit generating a second clock signal in accordance with a first clock signal.

2. Description of the Background Art

FIGS. 13A and 13B are time charts showing an operation principle of a conventional phase comparator. As shown in FIG. 13A, when a phase of a feedback clock signal FBCLK precedes a phase of an internal clock signal INTCLK, the feedback clock signal FBCLK is raised to the "H" level earlier than the internal clock signal INTCLK, so that the feedback clock signal FBCLK is at the "H" level when the internal clock signal INTCLK rises.

As shown in FIG. 13B, when a phase of a feedback clock signal FBCLK follows a phase of an internal clock signal INTCLK, the internal clock signal INTCLK is raised to the "H" level earlier than the feedback clock signal FBCLK, so that the feedback clock signal FBCLK is at the "L" level when the internal clock signal INTCLK rises.

A conventional phase comparator therefore detects a level of a feedback clock signal FBCLK in response to a rising edge of an internal clock signal INTCLK, and shows that a phase of the feedback clock signal FBCLK is preceding by setting signals φU and φD to the "H" level and the "L" level respectively if the feedback clock signal FBCLK is at the "H" level, and shows that a phase of the feedback clock signal FBCLK is delaying by setting signals φU and φD to the "L" level and the "H" level respectively if the feedback clock signal FBCLK is at the "L" level.

Therefore, it is possible to have a feedback clock signal FBCLK and an internal clock signal INTCLK in phase with each other by delaying the phase of the feedback clock signal FBCLK if the signals φU and φD are at the "H" level and the "L" level respectively, or by advancing the phase of the feedback clock signal FBCLK if the signals φU and φD are at the "L" level and the "H" level respectively.

Though the conventional phase comparator works well with an internal clock signal INTCLK and its delayed clock signal, i.e., a feedback clock signal FBCLK if they have the same waveforms, problems as follows will occur if the waveforms are different.

As shown in FIG. 14A, if a phase of a feedback clock signal FBCLK precedes a phase of an internal clock signal INTCLK while the rising of the feedback clock signal FBCLK is obtuse, the feedback clock signal FBCLK is at the "L" level when the internal clock signal INTCLK rises. As a result, the signals φU and φD will be at the "L" level and the "H" level respectively, so that the phase of the feedback clock signal FBCLK will further be advanced even though the phase of the feedback clock signal FBCLK is already preceding the phase of the internal clock signal INTCLK.

Furthermore, as shown in FIG. 14B, if an internal clock signal INTCLK and a feedback clock signal FBCLK are in phase while the duty ratio of the feedback clock signal FBCLK is above 50%, the feedback clock signal FBCLK is at the "H" level when the internal clock signal INTCLK rises. As a result, the signals φU and φD will be at the "H" level and the "L" level respectively, so that the phase of the feedback clock signal FBCLK will be advanced even though the internal clock signal INTCLK and the feedback clock signal FBCLK are in phase.

Furthermore, as shown in FIG. 14C, if an internal clock signal INTCLK and a feedback clock signal FBCLK are in phase while the duty ratio of the feedback clock signal FBCLK is below 50%, the feedback clock signal FBCLK is at the "L" level when the internal clock signal INTCLK rises. As a result, the signals φU and φD will be at the "L" level and the "H" level respectively, so that the phase of the feedback clock signal FBCLK will be delayed even though the internal clock signal INTCLK and the feedback clock signal FBCLK are in phase.

As mentioned above, the conventional phase comparator works well with an internal clock signal INTCLK and a feedback clock signal FBCLK having the same waveforms, while when the waveforms are different, it cannot accurately compare the phases of the internal clock signal INTCLK and the feedback clock signal FBCLK.

SUMMARY OF THE INVENTION

A main object of the present invention is to provide a phase comparator which can accurately compare phases of first and second clock signals and a clock generation circuit which employs the phase comparator.

A phase comparator according to the present invention includes a first level detection circuit detecting a level of a second clock signal in response to a rising edge of a first clock signal, a second level detection circuit detecting a level of a second clock signal in response to a falling edge of a first clock signal, a first logic circuit outputting a first signal indicating that the phase of the second clock signal precedes the phase of the first clock signal in response to the detection of the first and second levels by the first and second level detection circuits respectively, and a second logic circuit outputting a second signal indicating that the phase of the second clock signal follows the phase of the first clock signal in response to the detection of the second and the first levels by the first and second level detection circuits respectively.

Furthermore, a clock generation circuit according to the present invention includes a delay circuit delaying a first clock signal and generating a second clock signal, the delay circuit has a controllable delay time, a phase comparator comparing phases of the first and second clock signals, and a control circuit controlling the delay time of the delay circuit to have the first and second clock signals in phase with each other based on a comparison result of the phase comparator. The phase comparator includes a first level detection circuit detecting a level of a second clock signal in response to a rising edge of a first clock signal, a second level detection circuit detecting a level of a second clock signal in response to a falling edge of a first clock signal, a first logic circuit outputting a first signal indicating that the phase of the second clock signal precedes the phase of the first clock signal in response to the detection of the first and second levels by the first and second level detection circuits respectively, and a second logic circuit outputting a second signal indicating that the phase of the second clock signal follows the phase of the first clock signal in response to the detection of the second and the first levels by the first and second level detection circuits respectively.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 shows a relation between signals $\phi U1$, $\phi D1$, $\phi U2$, $\phi D2$ and signals $\phi K$, $\phi U$, $\phi D$ shown in FIG. 3.

FIGS. 8A and 8B are time charts specifically showing a relation between an internal clock signal INTCLK and a feedback clock signal FBCLK.

DESCRIPTION OF THE PREFERRED EMBODIMENTS

Figure 1:
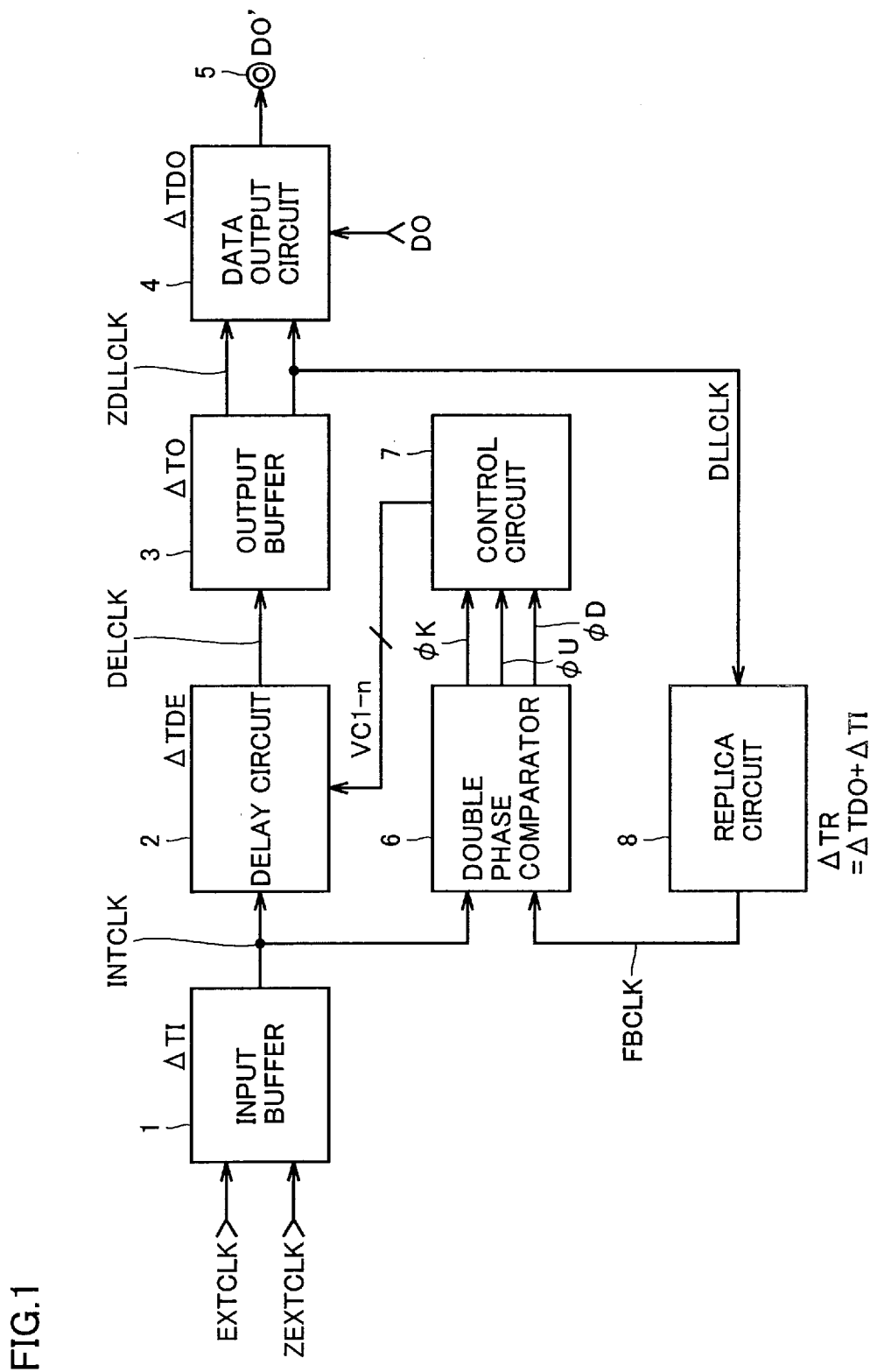
FIG. 1 is a block diagram of a main section of a semiconductor memory according to one embodiment of the present invention.

FIG. 1 is a block diagram of a main section of a semiconductor memory according to one embodiment of the present invention. In FIG. 1, the semiconductor memory includes an input buffer 1, a delay circuit 2, an output buffer 3, a data output circuit 4, a data output terminal 5, a double phase comparator 6, a control circuit 7, and a replica circuit 8. The elements except data output circuit 4 and data output terminal 5 configure a Delay Locked Loop (DLL) circuit.

Input buffer 1 generates an internal clock signal INTCLK in response to an external clock signal EXTCLK and an inversion clock signal ZEXTCLK thereof, and then provides the internal clock signal INTCLK to delay circuit 2 and double phase comparator 6.

Delay circuit 2 delays the internal clock signal INTCLK from input buffer 1 with a delay time $\Delta TDE$ corresponding to control signals VC1–VCn (n is a natural number) to generate a clock signal DELCLK, and provides the clock signal DELCLK to output buffer 3.

Figure 2:
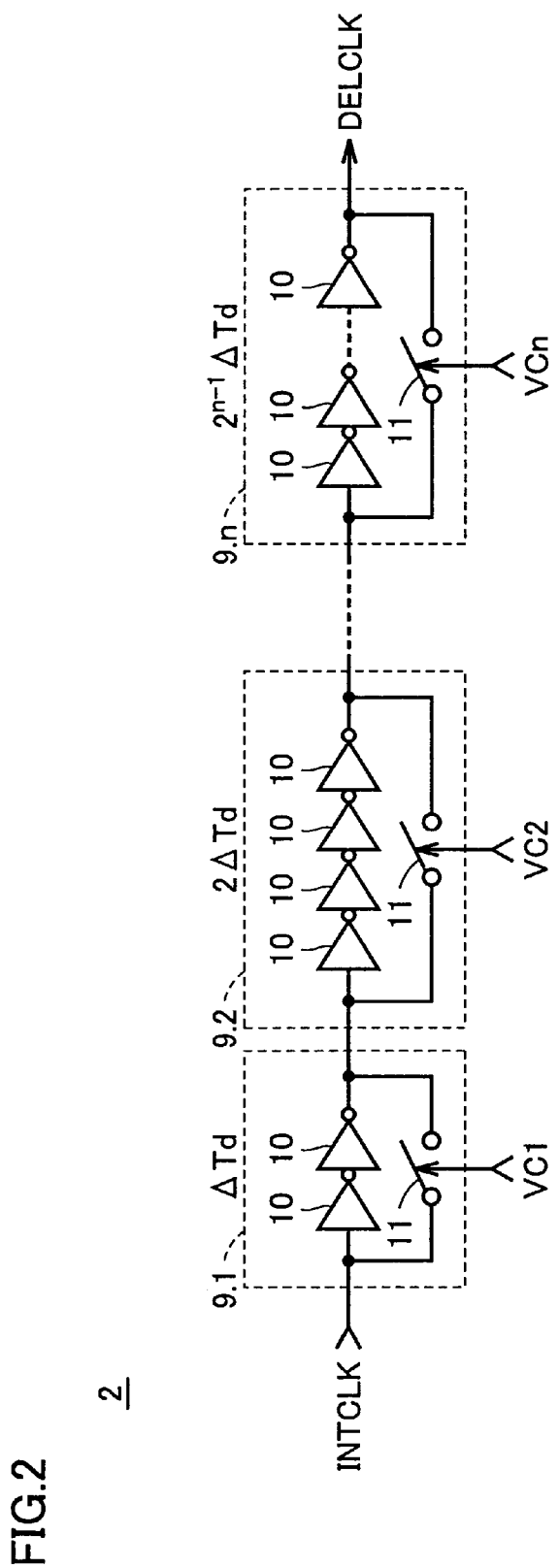
FIG. 2 is a circuit diagram showing a configuration of a delay circuit shown in FIG. 1.

As shown in FIG. 2, delay circuit 2 includes n delay unit circuits 9.1–9.n connected in series. Delay unit circuit 9.n includes an even number ($2n$ in the figure) of inverters 10 connected in series and a switch 11 connected in parallel to the row of inverters 10. The row of inverters 10 have a prescribed delay time of $2^{n-1}\Delta Td$. Switch 11 is controlled by a control signal VCn. When the control signal VCn is at the "H" level, switch 11 will be nonconductive and the delay time of the delay unit circuit 9.n will be $2^{n-1}\Delta Td$; and when the control signal VCn is at the "L" level, switch 11 will be conductive and the delay time of the delay unit circuit 9.n will be zero. Delay time $\Delta TDE$ of delay circuit 2 may have $2^n$ different values by setting each of the control signals VC1–VCn to the "H" level or the "L" level.

Output buffer 3 generates a clock signal DLLCLK and an inversion clock signal ZDLLCLK thereof in response to an output clock signal DELCLK from delay circuit 2 and provides them to data output circuit 4. Data output circuit 4 outputs a read data signal DO from the memory cell selected by an address signal from a plurality of memory cells (not shown) to data output terminal 5 in synchronization with rising edges and falling edges of clock signals DLLCLK and ZDLLCLK from output buffer 3.

Delay time $\Delta TDE$ of delay circuit 2 is controlled such that the sum time $\Delta TI+\Delta TDE+\Delta TO+\Delta TDO$ of a delay time $\Delta TI$ of input buffer 1, a delay time $\Delta TDE$ of delay circuit 2, a delay time $\Delta TO$ of output buffer 3, and a delay time $\Delta TDO$ of data output circuit 4 equals one cycle of the external clock signal EXTCLK or an integer multiple thereof. This enables the read data signal DO to be output to external terminal 5 in synchronization with, for example, a rising edge of the external clock signal EXTCLK.

Replica circuit 8 includes input buffer 1 and a circuit similar to data output circuit 4. It generates a feedback clock signal FBCLK by delaying clock signal DLLCLK from output buffer 3 with a prescribed delay time $\Delta TR=\Delta TDO+\Delta TI$, and provides the feedback clock signal FBCLK to double phase comparator 6.

Double phase comparator 6 detects the level of the feedback clock signal FBCLK from replica circuit 8 in synchronization with both the rising and falling edges of the internal clock signal INTCLK from input buffer 1, generates signals $\phi K$, $\phi U$ and $\phi D$ based on the detection result, and provides the signals $\phi K$, $\phi U$ and $\phi D$ to control circuit 7. Herein, the signal $\phi K$ is set to the "L" level if the feedback clock signal FBCLK has a normal waveform, and is set to the "H" level if it has an abnormal waveform. The signal $\phi U$ is set to the "L" level if a phase of the feedback clock signal FBCLK follows a phase of the internal clock signal INTCLK, and is set to the "H" level if a phase of the feedback clock signal FBCLK precedes a phase of the internal clock signal INTCLK. The signal $\phi D$ is set to the "L" level if a phase of the feedback clock signal FBCLK precedes a phase of the internal clock signal INTCLK, and is set to the "H" level if a phase of the feedback clock signal FBCLK follows a phase of the internal clock signal INTCLK.

Figure 3:
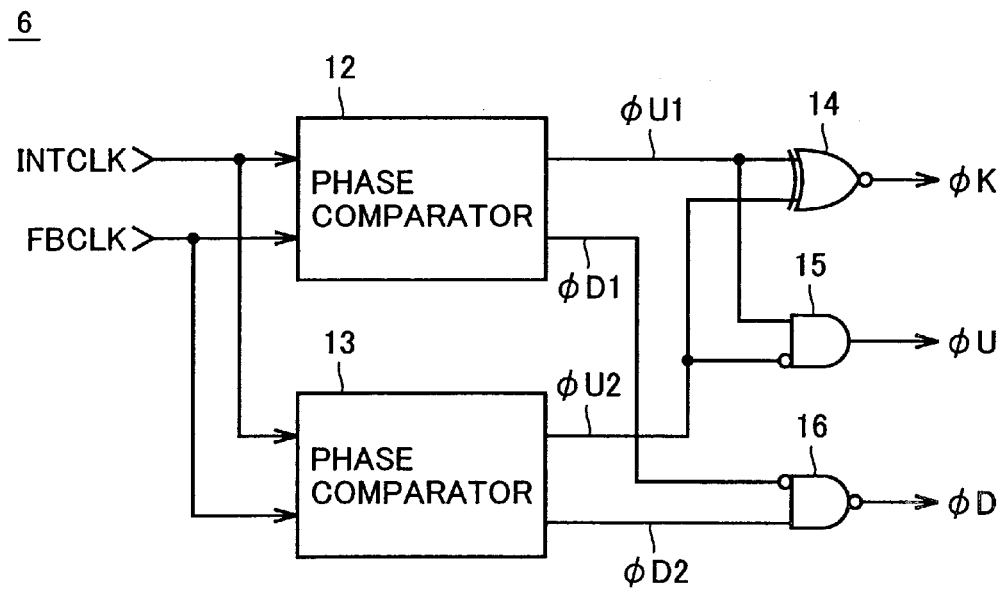
FIG. 3 is a circuit block diagram showing a configuration of a double phase comparator shown in FIG. 1.

As shown in FIG. 3, double phase comparator 6 includes two phase comparators 12 and 13, an EX-OR gate 14, and gate circuits 15 and 16. Phase comparator 12 sets the signals $\phi U1$ and $\phi D1$ to the "H" level and the "L" level respectively if the feedback clock signal FBCLK is at the "H" level when the internal clock signal INTCLK rises, and sets the signals $\phi U1$ and $\phi D1$ to the "L" level and the "H" level respectively if the feedback clock signal FBCLK is at the "L" level when the internal clock signal INTCLK rises. Phase comparator 13 sets the signals $\phi U2$ and $\phi D2$ to the "H" level and the "L" level respectively if the feedback clock signal FBCLK is at the "H" level when the internal clock signal INTCLK falls, and sets the signals $\phi U2$ and $\phi D2$ to the "L" level and the "H" level respectively if the feedback clock signal FBCLK is at the "L" level when the internal clock signal INTCLK falls.

Figure 4:
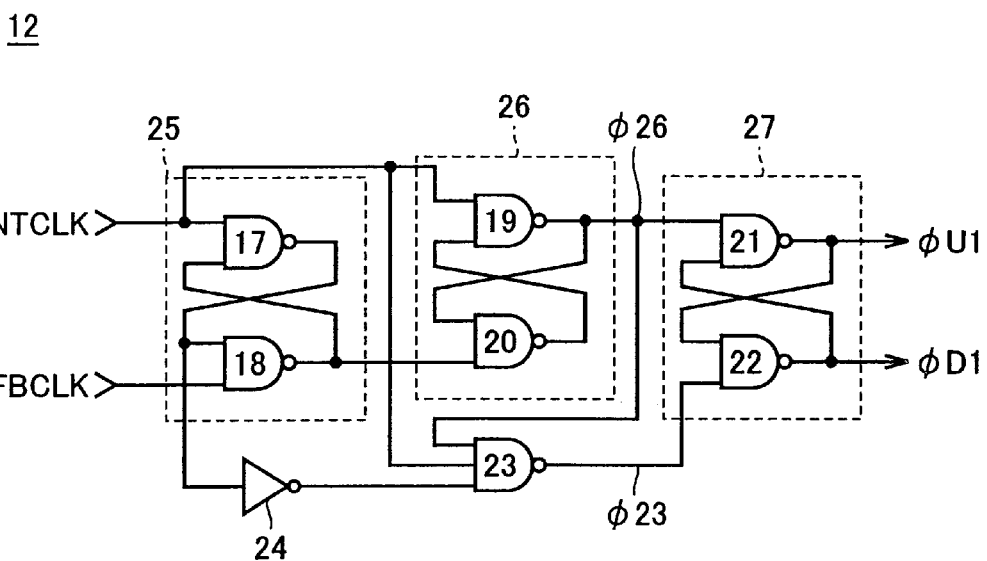
FIG. 4 is a circuit diagram showing a configuration of a phase comparator 12 shown in FIG. 3.

FIG. 4 is a circuit diagram showing a configuration of phase comparator 12. In FIG. 4, phase comparator 12 includes NAND gates 17–23 and an inverter 24. NAND gates 17 and 18, 19 and 20, and 21 and 22 form flip flops 25–27 respectively. The internal clock signal INTCLK is input to set terminals of flip flops 25, 26 and a first input terminal of NAND gate 23. The feedback clock signal FBCLK is input to a reset terminal of flip flop 25. An output signal of flip flop 25 is input via inverter 24 to a second input terminal of NAND gate 23. An inversion output signal of flip flop 25 is input to a reset terminal of flip flop 26. An output signal $\phi26$ of flip flop 26 is input to a set terminal of flip flop 27 and to a third input terminal of NAND gate 23. An output signal $\phi23$ of NAND gate 23 is input to a reset terminal of flip flop 27. An output signal and an inversion output signal of flip flop 27 will be the signals $\phi U1$ and $\phi D1$, respectively.

Figure 5:
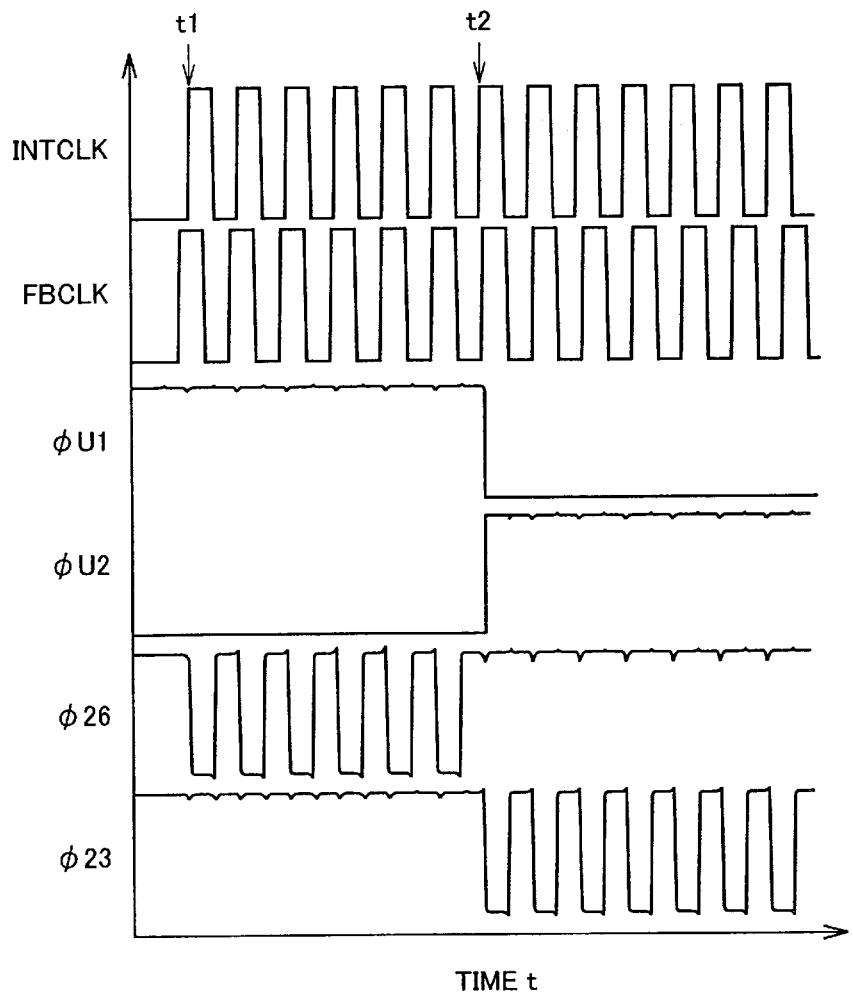
FIG. 5 is a time chart showing an operation of phase comparator 12 shown in FIG. 4.

FIG. 5 is a time chart showing an operation of phase comparator 12 shown in FIG. 4. In FIG. 5, both the internal clock signal INTCLK and the feedback clock signal FBCLK are set to the "L" level in the initial state. In this condition, both of the output signals of NAND gates 17 and 18 are in the "H" state, flip flop 26 is set to raise the signal $\phi26$ to the "H" level, and the output signal $\phi23$ of NAND gate 23 is at the "H" level. Furthermore, in the initial state, the signals $\phi U1$ and $\phi D1$ are set to the "H" level and the "L" level respectively by separate circuit.

When a phase of the feedback clock signal FBCLK precedes a phase of the internal clock signal INTCLK, firstly the feedback clock signal FBCLK is raised from the "L" level to the "H" level. Consequently, the output signal of NAND gate 18 is set to the "L" level, the output signal of NAND gate 20 is set to the "H" level, and the output signal of inverter 24 is set to the "L" level, while the levels of the signals $\phi26$, $\phi23$, $\phi U1$, and $\phi D1$ are unchanged.

Then, when the internal clock signal INTCLK is raised from the "L" level to the "H" level (time t1), flip flop 26 is reset and the signal $\phi26$ falls to the "L" level. This sets flip flop 27, however the signal $\phi U1$ will remain at the "H" level since it is set to the "H" level in the initial state.

Then, when the feedback clock signal FBCLK is lowered from the "H" level to the "L" level, the output signal of NAND gate 18 is set to the "H" level and the output signal of inverter 24 is set to the "H" level, while the levels of the signals $\phi26$, $\phi23$, $\phi U1$, and $\phi D1$ are unchanged.

Then, when the internal clock signal INTCLK is lowered from the "H" level to the "L" level, flip flop 26 is set to raise the signal $\phi26$ to the "H" level, the output signal of NAND gate 20 is set to the "L" level, the output signal of NAND gate 17 is set to the "H" level, and the output signal of inverter 24 is set to the "L" level, while the levels of the signals $\phi23$, $\phi U1$ and $\phi D1$ are unchanged.

The phase of the feedback clock signal FBCLK is gradually delayed, and when the internal clock signal INTCLK is raised from the "L" level to the "H" level in the "L" level period of the feedback clock signal FBCLK (time t2), flip flop 25 is reset to set the output signal of NAND gate 17 to the "L" level, the output signal of inverter 24 is set to the "H" level, and the output signal $\phi23$ of NAND gate 23 is set to the "L" level. Consequently, flip flop 27 is reset and the signals $\phi U1$ and $\phi D1$ will be set to the "L" level and the "H" level, respectively.

Then, the feedback clock signal FBCLK is raised from the "L" level to the "H" level. At this time, as the output signal of NAND gate 17 is already set to the "L" level, the output signal of NAND gate 18 remains at the "H" level, and the levels of the signals $\phi U1$ and $\phi D1$ are also unchanged.

Then, when the internal clock signal INTCLK is lowered from the "H" level to the "L" level, the output signal of NAND gate 17 is set to the "H" level, the output signal of NAND gate 18 is set to the "L" level, the output signal of NAND gate 20 is set to the "H" level, the output signal of inverter 24 is set to the "L" level, and the output signal $\phi23$ of NAND gate 23 is set to the "H" level, while the levels of the signals $\phi U1$ and $\phi D1$ are unchanged.

Then, when the feedback clock signal FBCLK is lowered from the "H" level to the "L" level, the output signal of NAND gate 18 is set to the "H" level and the output signal of NAND gate 20 is set to the "L" level, while the levels of the signals $\phi26$, $\phi23$, $\phi U1$, and $\phi D1$ are unchanged.

Figure 6:
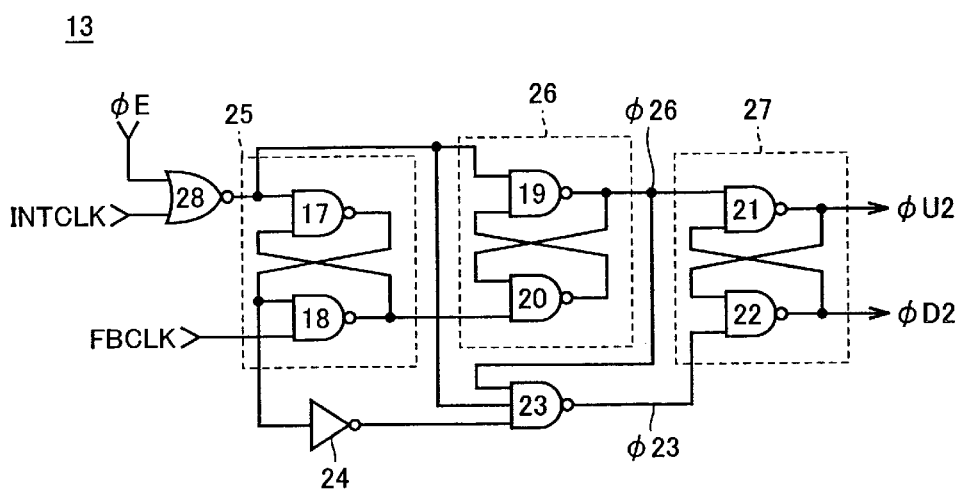
FIG. 6 is a circuit diagram showing a configuration of a phase comparator 13 shown in FIG. 3.

FIG. 6 is a circuit diagram showing a configuration of phase comparator 13. Referring to FIG. 6, this phase comparator 13 differs from phase comparator 12 of FIG. 4 in that an NOR gate 28 is added. NOR gate 28 receives a signal $\phi E$ and the internal clock signal INTCLK, and its output signal is input to a set terminal of flip flop 25. The signal $\phi E$ is set to the "H" level in the initial state and is set to the "L" level when the initial state is released. Therefore, the output signal of NOR gate 28 is fixed to the "L" level in the initial state, and will become the inversion clock signal of the internal clock signal INTCLK when the initial state is released. Thus, in phase comparator 13, the signals $\phi U2$ and $\phi D2$ are generated based on the level of the feedback clock signal FBCLK at the falling edge of the internal clock signal INTCLK.

Referring back to FIG. 3, EX-NOR gate 14 receives the signals $\phi U1$ and $\phi U2$ and outputs the signal $\phi K$. The signal $\phi K$ is set to the "L" level when the levels of the signals $\phi U1$ and $\phi U2$ are different, and is set to the "H" level when the levels of the signals $\phi U1$ and $\phi U2$ are the same. Gate circuit 15 receives the signals $\phi U1$ and $\phi U2$ and outputs the signal $\phi U$. The signal $\phi U$ is set to the "H" level only when the signals $\phi U1$ and $\phi U2$ are at the "H" level and the "L" level respectively. Otherwise, the signal $\phi U$ is set to the "L" level. Gate circuit 16 receives the signals $\phi D1$ and $\phi D2$ and outputs the signal $\phi D$. The signal $\phi D$ is set to the "L" level only when the signals $\phi D1$ and $\phi D2$ are at the "L" level and the "H" level respectively. Otherwise, the signal $\phi D$ is set to the "H" level.

FIG. 7 shows a relation between the signals $\phi U1$, $\phi D1$, $\phi U2$, $\phi D2$ and the signals $\phi K$, $\phi U$, $\phi D$. The signals $\phi U1$ and $\phi D1$, $\phi U2$ and $\phi D2$, and $\phi U$ and $\phi D$ are complementary to each other respectively. In a first state, the levels of the signals $\phi U1$ and $\phi U2$ are different and the signal $\phi U1$ is at the "H" level; in a second state, the levels of the signals $\phi U1$ and $\phi U2$ are different and the signal $\phi U1$ is at the "L" level; in a third state, the levels of the signals $\phi U1$ and $\phi U2$ are the same and the signal $\phi U1$ is at the "L" level; and, in a fourth state, the levels of the signals $\phi U1$ and $\phi U2$ are the same and the signal $\phi U1$ is at the "H" level.

FIGS. 8A and 8B are time charts specifically showing a relation between the internal clock signal INTCLK and the feedback clock signal FBCLK. In FIGS. 8A and 8B, the feedback clock signals FBCLKs have normal waveforms.

As shown in FIG. 8A, if the phase of the feedback clock signal FBCLK precedes the phase of the internal clock signal INTCLK, the feedback clock signal FBCLK is at the "H" level when the internal clock signal INTCLK rises, and the feedback clock signal FBCLK is at the "L" level when the internal clock signal INTCLK falls. This is the first state of FIG. 7, and the signals $\phi K$, $\phi U$ and $\phi D$ will be at the "L" level, the "H" level and the "L" level, respectively.

As shown in FIG. 8B, if the phase of the feedback clock signal FBCLK follows the phase of the internal clock signal INTCLK, the feedback clock signal FBCLK is at the "L" level when the internal clock signal INTCLK rises, and the feedback clock signal FBCLK is at the "H" level when the internal clock signal INTCLK falls. This is the second state of FIG. 7, and the signals φK, φU and φD will be at the "L" level, the "L" level and the "H" level, respectively.

Figure 9A:
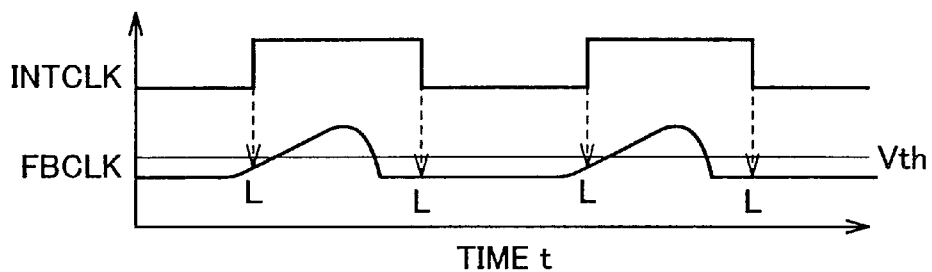
FIGS. 9A–9C are other time charts specifically showing a relation between the internal clock signal INTCLK and the feedback clock signal FBCLK.
Figure 9B:
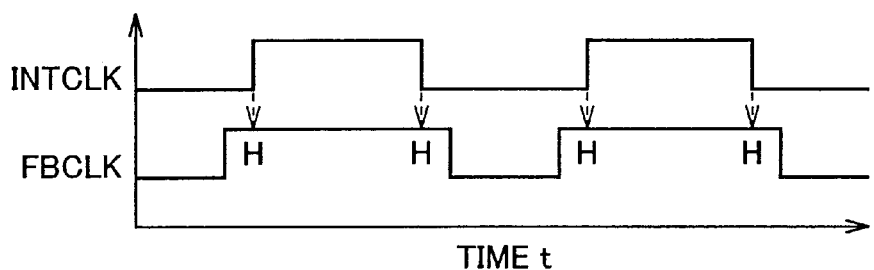
Figure 9C:
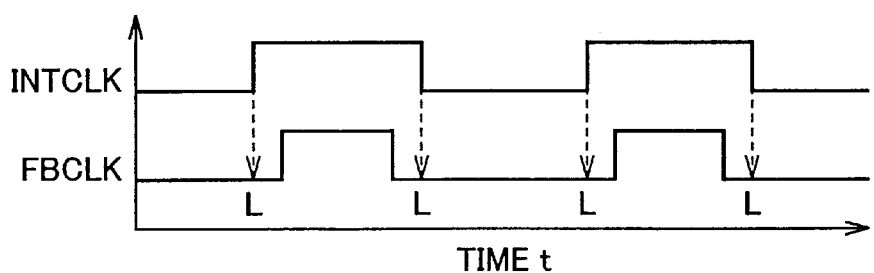

FIGS. 9A–9C are other time charts specifically showing a relation between the internal clock signal INTCLK and the feedback clock signal FBCLK. FIGS. 9A–9C show that the feedback clock signals FBCLKs have abnormal waveforms.

As shown in FIG. 9A, if the phase of the feedback clock signal FBCLK precedes the phase of the internal clock signal INTCLK while the waveform of the feedback clock signal FBCLK is deformed such that the rising and falling are obtuse, the level of the feedback clock signal FBCLK will become lower than a threshold voltage Vth at both the rising and falling edges of the internal clock signal INTCLK. This is the third state of FIG. 7, and the signals φK, φU and φD will be at the "H" level, the "L" level and the "H" level, respectively.

As shown in FIG. 9B, if the internal clock signal INTCLK and the feedback clock signal FBCLK are in phase while the duty ratio of the feedback clock signal FBCLK is above 50%, the feedback clock signal FBCLK will be at the "H" level at both the rising and falling edges of the internal clock signal INTCLK. This is the fourth state of FIG. 7, and the signals φK, φU and φD will be at the "H" level, the "L" level and the "H" level, respectively.

As shown in FIG. 9C, if the internal clock signal INTCLK and the feedback clock signal FBCLK are in phase while the duty ratio of the feedback clock signal FBCLK is below 50%, the feedback clock signal FBCLK will be at the "L" level at both the rising and falling edges of the internal clock signal INTCLK. This is the third state of FIG. 7, and the signals φK, φU and φD will be at the "H" level, the "L" level and the "H" level, respectively.

Referring back to FIG. 1, control circuit 7 generates control signals VC1–VCn according to the signals φK, φU and φD from double phase comparator 6, and provides the control signals VC1–VCn to delay circuit 2 to control the delay time ΔTDE of delay circuit 2.

Figure 10:
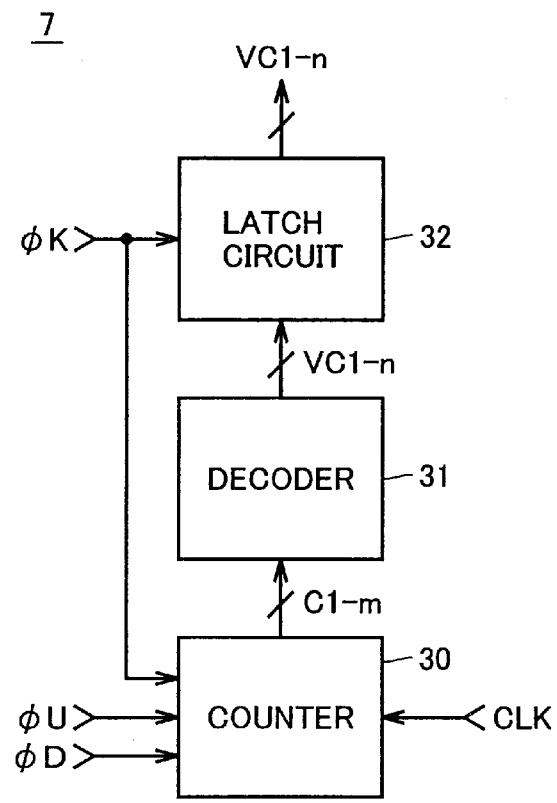
FIG. 10 is a block diagram showing a configuration of a control circuit shown in FIG. 1.

As shown in FIG. 10, control circuit 7 includes a counter 30, a decoder 31 and a latch circuit 32. Counter 30 is activated when the signal φK is at the "L" level, and is deactivated when the signal φK is at the "H" level. Activated counter 30 operates as an up counter if the signals φU and φD are at the "H" level and the "L" level respectively, and increments the values of count signals C1–Cm (m is a natural number) by one whenever a pulse of the clock signal CLK is input. Activated counter 30 also operates as a down counter if the signals φU and φD are at the "L" level and the "H" level respectively, and decrements the values of the count signals C1–Cm by one whenever a pulse of the clock signal CLK is input. Therefore, the count values of the count signals C1–Cm gradually increase if the phase of the feedback clock signal FBCLK precedes the phase of the internal clock signal INTCLK, and the count value gradually decrease if the phase of the feedback clock signal FBCLK follows the phase of the internal clock signal INTCLK.

Decoder 31 decodes the count signals C1–Cm from counter 30 to generate the control signals VC1–VCn, and provides the control signals VC1–VCn to delay circuit 2 via latch circuit 32 to control the delay time ΔTDE of delay circuit 2. Decoder 31 makes the delay time ΔTDE longer to delay the phase of the feedback clock signal FBCLK when the count values of the count signals C1–Cm increased, or it makes the delay time ΔTDE shorter to advance the phase of the feedback clock signal FBCLK when the count values of the count signals C1–Cm decreased. Latch circuit 32 receives the control signals VC1–VCn and provides the control signals directly to the delay circuit 2 if the signal φK is at the "L" level, while when the signal φK is raised from the "L" level to the "H" level, it latches the immediately preceding control signals VC1–VCn and provides them to delay circuit 2.

Figure 11:
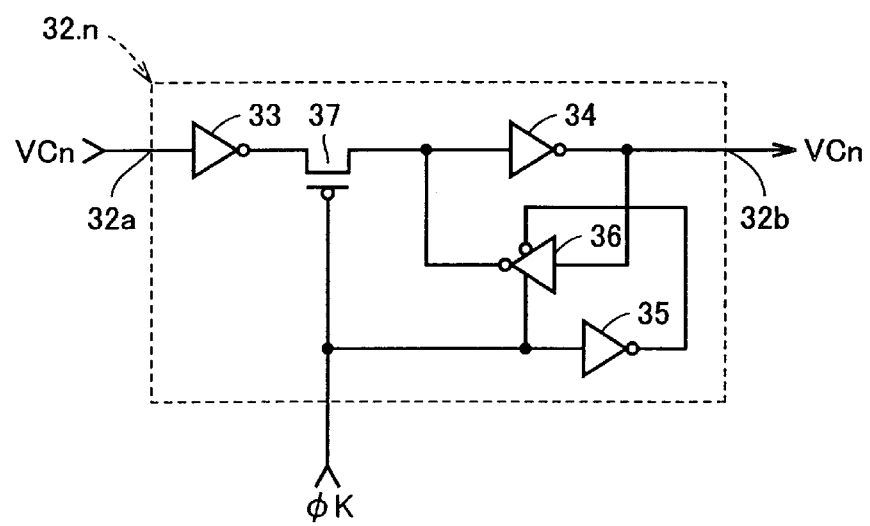
FIG. 11 is a circuit diagram showing a main section of a latch circuit shown in FIG. 10.

FIG. 11 is a circuit diagram showing a configuration of latch unit circuit 32.n of latch circuit 32 corresponding to the control signal VCn. In FIG. 11, latch unit circuit 32.n includes inverters 33–35, a clocked inverter 36 and a P-channel MOS transistor 37. Inverter 33, P-channel MOS transistor 37 and inverter 34 are connected in series between an input node 32a and an output node 32b. Clocked inverter 36 is connected to inverter 34 in anti-parallel. The signal φK is directly input to a gate of P-channel MOS transistor 37 and a control node of clocked inverter 36, and is also input to inversion control node of clocked inverter 36 via inverter 35.

If the signal φK is at the "L" level, P-channel MOS transistor 37 is conductive and, at the same time, clocked inverter 36 is deactivated, so the signal VCn is provided through inverter 33, P-channel MOS transistor 37 and inverter 34 to delay circuit 2. When the signal φK is raised from the "L" level to the "H" level, P-channel MOS transistor 37 will be nonconductive and, at the same time, clocked inverter 36 is activated, so the level of output node 32b is latched by inverters 34 and 36. Therefore, the level of the output signal VCn is kept at the level immediately before the signal φK changed from the "L" level to the "H" level.

Figure 12:
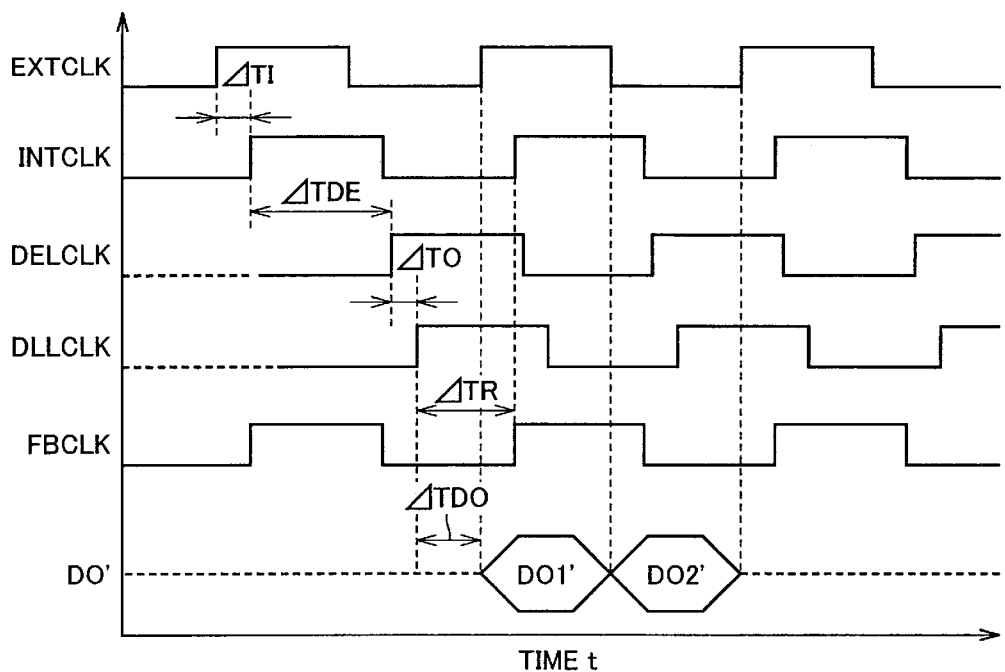
FIG. 12 is a time chart showing an operation of a main section of the semiconductor memory shown in FIGS. 1–11.
Figure 13A:
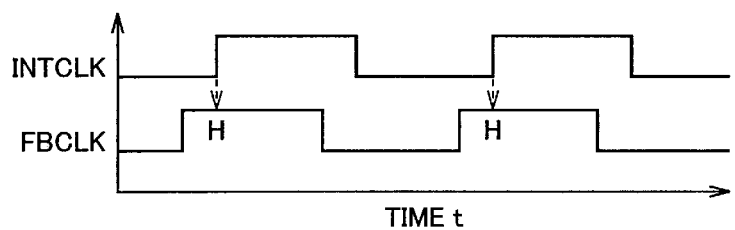
FIGS. 13A and 13B are time charts showing an operation principle of a conventional phase comparator.
Figure 13B:
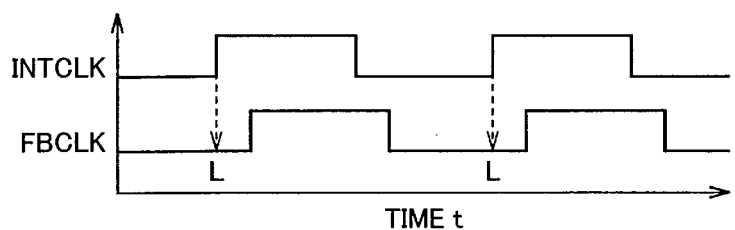
Figure 14A:
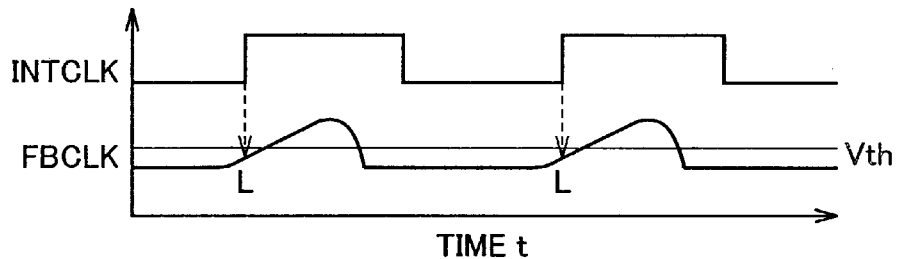
FIGS. 14A–14C are time charts for illustrating problems with the conventional phase comparator.
Figure 14B:
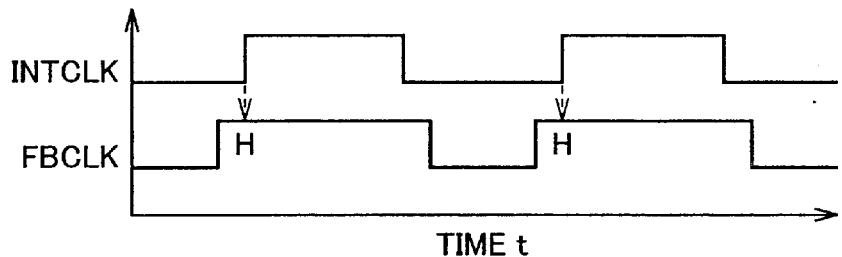
Figure 14C:
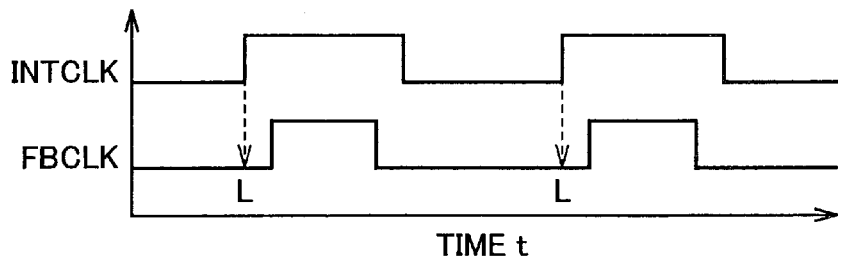

FIG. 12 is a time chart showing an operation of a main section of the semiconductor memory shown in FIGS. 1–11. In FIG. 12, the external clock signal EXTCLK is delayed with a delay time ΔTI by the input buffer 1 to be the internal clock signal INTCLK. The internal clock signal INTCLK is provided to delay circuit 2 and double phase comparator 6.

The internal clock signal INTCLK is delayed with a variable delay time ΔTDE by delay circuit 2 to be the clock signal DELCLK which is further delayed with a delay time ΔTO by output buffer 3 to be the clock signal DLLCLK. Data output circuit 4 outputs read data signals DO1' and DO2' successively in response to rising and falling edges of the clock signal DLLCLK. There is a prescribed delay time ΔTDO between a rising edge of the clock signal DLLCLK and the start time of outputting the read data signal DO1'. The start time of outputting the read data signal DO1' corresponds to a rising edge of the external clock signal EXTCLK.

The clock signal DLLCLK is delayed with a delay time ΔTR=ΔTDO+ΔTI by replica circuit 8 to be the feedback clock signal FBCLK. Double phase comparator 6 and control circuit 7 control the delay time ΔTDE of delay circuit 2 such that the internal clock signal INTCLK and the feedback clock signal FBCLK will be in phase.

This means that, if the phase of the feedback clock signal FBCLK precedes the phase of the internal clock signal INTCLK, the delay time ΔTDE of delay circuit 2 is made longer to delay the phase of the feedback clock signal FBCLK, and if the phase of the feedback clock signal FBCLK follows the phase of the internal clock signal INTCLK, the delay time ΔTDE of delay circuit 2 is made shorter to advance the phase of the feedback clock signal FBCLK. Therefore, the internal clock signal INTCLK and the feedback clock signal FBCLK will be in phase.

If the waveform of the feedback clock signal FBCLK is deformed or the duty ratio of the feedback clock signal FBCLK deviates from 50% when the internal clock signal INTCLK and the feedback clock signal FBCLK are in phase, the signal φK will be set to the "H" level where the count operation of counter 30 is stopped and the control signals VC1–VCn are latched. Therefore, in contrast to the conventional phase comparator, the internal clock signal INTCLK and the feedback clock signal FBCLK will not be determined as out of phase and the delay time ΔTDE of delay circuit 2 will remain unchanged when the signals actually are in phase.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase comparator comparing phases of first and second clock signals, comprising:
    a first level detection circuit for detecting a level of said second clock signal in response to a rising edge of said first clock signal;
    a second level detection circuit for detecting a level of said second clock signal in response to a falling edge of said first clock signal;
    a first logic circuit connected to receive output signals of said first and second level detection circuits for outputting a first signal indicating that the phase of said second clock signal precedes the phase of said first clock signal in response to detection of a first level and a second level by said first and second level detection circuits, respectively;
    a second logic circuit connected to receive the output signals of said first and second level detection circuits for outputting a second signal indicating that the phase of said second clock signal follows the phase of said first clock signal in response to detection of a second level and a first level by said first and second level detection circuits, respectively; and
    a third logic circuit connected to receive the output signals of said first and second level detection circuits for outputting a third signal indicating that waveforms of said first and second clock signals are different in response to detection of a first level and a second level by said first and second level detection circuits being in correspondence with each other.

2. A clock generation circuit generating a second clock signal in accordance with a first clock signal, comprising:
    a delay circuit delaying said first clock signal and generating said second clock signal, wherein said delay circuit has a controllable delay time;
    a phase comparator for comparing phases of said first and second clock signals; and
    a control circuit for controlling the delay time of said delay circuit to have said first and second clock signals in phase with each other based on a comparison result of said phase comparator; wherein
    said phase comparator includes:
    a first level detection circuit for detecting a level of said second clock signal in response to a rising edge of said first clock signal;
    a second level detection circuit for detecting a level of said second clock signal in response to a falling edge of said first clock signal;
    a first logic circuit connected to receive output signals of said first and second level detection circuits for outputting a first signal indicating that the phase of said second clock signal precedes the phase of said first clock signal in response to detection of a first level and a second level by said first and second level detection circuits, respectively;
    a second logic circuit connected to receive the output signals of said first and second level detection circuits for outputting a second signal indicating that the phase of said second clock signal follows the phase of said first clock signal in response to detection of a second level and a first level by said first and second level detection circuits, respectively; and
    a third logic circuit connected to the receive output signals of said first and second level detection circuits for outputting a third signal indicating that waveforms of said first and second clock signals are different in response to detection of a first level and a second level by said first and second level detection circuits being in correspondence with each other.

3. The clock generation circuit according to claim 2, wherein
    said control circuit holding the delay time of said delay circuit constant, in response to said third signal being output from said third logic circuit.

* * * * *